(12) United States Patent
Wang

(10) Patent No.: US 8,314,911 B2
(45) Date of Patent: Nov. 20, 2012

(54) LIQUID CRYSTAL PANEL AND MANUFACTURING METHOD THEREOF

(75) Inventor: Yanfeng Wang, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 317 days.

(21) Appl. No.: 12/724,585

(22) Filed: Mar. 16, 2010

(65) Prior Publication Data

US 2010/0238390 A1 Sep. 23, 2010

(30) Foreign Application Priority Data

Mar. 18, 2009 (CN) .......................... 2009 1 0080091

(51) Int. Cl.
*G02F 1/1337* (2006.01)

(52) U.S. Cl. ....................................................... 349/129
(58) Field of Classification Search .................. 349/129
See application file for complete search history.

(56) References Cited

U.S. PATENT DOCUMENTS 7,379,142 B2 * 5/2008 Tak et al. ...................... 349/129
* cited by examiner

*Primary Examiner* — Phu Vu
(74) *Attorney, Agent, or Firm* — Ladas & Parry LLP

(57) ABSTRACT

The embodiment of the invention provides a liquid crystal panel, comprising a color filter substrate, an array substrate and a layer of liquid crystal molecules interposed between the color filter substrate and the array substrate. The color filter substrate includes a black matrix, color filters, a protection layer and a common electrode formed a substrate, and cut-off patterns used to decrease motion speeds of impurity ions are formed in the common electrode so as to suppress image sticking.

9 Claims, 4 Drawing Sheets

LIQUID CRYSTAL PANEL AND MANUFACTURING METHOD THEREOF

BACKGROUND

The present invention relates to a liquid crystal panel and a manufacturing method thereof.

A liquid crystal panel comprises an array substrate, a color filter substrate and a layer of liquid crystal molecules interposed between the array substrate and the color filter substrate. The array substrate comprises a plurality of gate lines, a plurality of data lines, a plurality of pixel electrodes and a plurality of thin film transistors. The gate lines and the data lines perpendicular to each other define a plurality of pixel regions. The thin film transistors and the pixel electrodes are formed in the pixel regions. The gate lines are used to provide gate signals such as an "ON" signal to the thin film transistors, the data lines are used to provide data signals to the pixel electrodes, and grey scale display is realized by the modifying the orientation of the liquid crystal molecules through an electrical field. The color filter substrate comprises a black matrix, color filters and a protection layer and a common electrode. The color filters may comprise red, blue and green filters. The main purpose for providing the black matrix is to isolate the color filters while block light in light-leaking regions.

When a LCD is in use for a long time, an electrical field is formed between the data line corresponding to each pixel on array substrate and the common electrode below the color filters on the color filter substrate, and the voltage on the common electrode remains unchanged after being adjusted to an appropriate value. The electric field formed between one data line corresponding to a pixel with a high grey scale and the common electrode is larger than that between one data line corresponding to a pixel with a low grey scale and the common electrode. If the high grey scale region is adjacent to the low grey scale region, the ions in the low grey scale region will move to the high grey scale region, which leads to a large number of impurity ions congregated at a bordering portion between the high grey scale region and the low grey scale region. When the high grey scale region and the low grey scale region are returned to a same grey scale simultaneously, the congregated ions cannot be immediately moved away and the electric field generated by the congregated ions in the portion will influence the orientation of the liquid crystal molecules, which leads to abnormal display and image sticking. That is to say, in switching between the images, the shadow of the last image remains and the display performance is deteriorated.

SUMMARY

One embodiment of the invention provides a liquid crystal panel, comprising a color filter substrate, an array substrate and a layer of liquid crystal molecules interposed between the color filter substrate and the array substrate. The color filter substrate includes a black matrix, color filters, a protection layer and a common electrode formed a substrate, and cut-off patterns used to decrease motion speeds of impurity ions are formed in the common electrode so as to suppress image sticking.

Another embodiment of the invention provides a manufacturing method of a liquid crystal panel, the liquid crystal panel comprises a color filter substrate, an array substrate and a layer of liquid crystal molecules interposed between the color filter substrate and the array substrate, and the manufacturing method of the liquid crystal panel comprises providing the color filter substrate and providing the array substrate. Providing the color filter substrate comprises: step 1 of forming a black matrix and color filters on a substrate; step 2 of forming a protection layer on the substrate after step 1; and step 3 of forming a common electrode on the substrate after step 2, wherein cut-off patterns used to decrease motion speeds of impurity ions are formed in the common electrode so as to suppress image sticking.

BRIEF DESCRIPTION OF THE DRAWING

The present invention will become more fully understood from the detailed description given hereinafter and the accompanying drawings which are given by way of illustration only, and thus are not limitative of the present invention and wherein.

DESCRIPTION OF THE PREFERRED EMBODIMENTS

The embodiments of the invention will be further described with reference to the drawings.

In a liquid crystal panel according to an embodiment of the invention, a cut-off pattern is formed on a common electrode of a color filter substrate so as to separate the portion of the common electrode at a location corresponds to a data line on an array substrate. Hence, substantially no electrical field is formed between the data line and the common electrode below color filters, so that the change of the electrical field, which is caused by the impurity ions in the liquid crystal molecules in a case that a high grey scale region and a low grey scale region are adjacent to each other, is improved. Therefore, the phenomenon of image sticking can be reduced and the display performance of the liquid crystal panel can be improved.

Figure 1A:
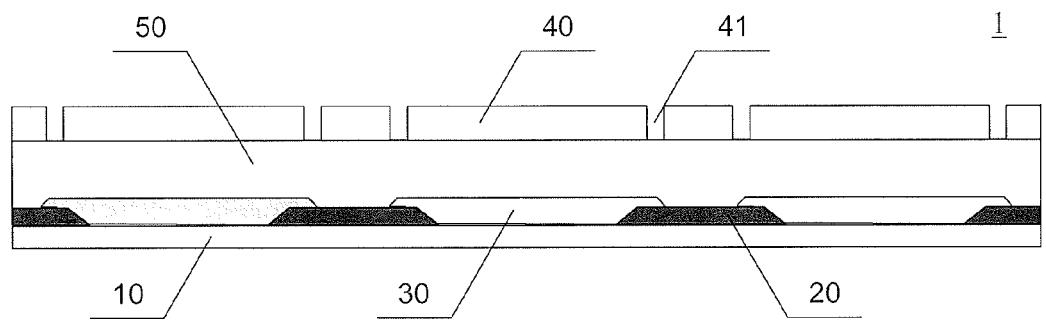
FIG. 1A is a structural schematic view of a color filter substrate of a liquid crystal panel according to a first embodiment of the invention.

FIG. 1A is a structural schematic view of a color filter substrate of a liquid crystal panel according to a first embodiment of the invention.

As shown in FIG. 1A, the liquid crystal panel according to the embodiment comprises a color filter substrate, an array substrate and a layer of liquid crystal molecules interposed between the color filter substrate and the array substrate. The color filter substrate 1 comprises a substrate 10, a black matrix 20, color filters 30, a common electrode 40 and a protection layer 50. The black matrix 20 and the color filters 30 are formed on the substrate 1. The color filters 30 may comprise filters in three colors: red filter, blue filter and green filter, but not limited to the above combination. The color filters 30 in the three primary colors are formed each within the black matrix 20 subsequently. The protection layer 50 is formed on the black matrix 20 and the color filters 30 and covers the whole substrate 10. The common electrode 40 is formed on the protection layer 50 and covers the whole substrate 10 also. The common electrode 40 is etched so as to form cut-off patterns therein. In the embodiment, the cut-off patterns comprise closed ring-shaped grooves 41.

Figure 1B:
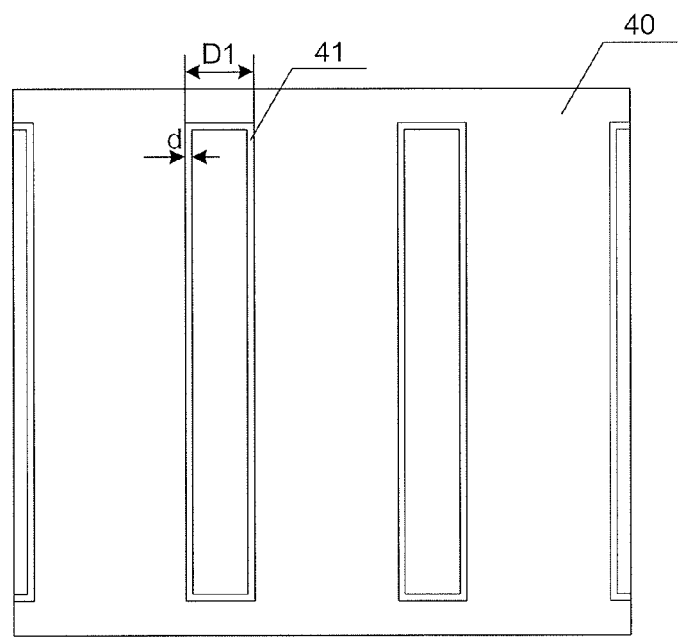
FIG. 1B is a planar schematic view of the common electrode of the color filter substrate of the liquid crystal panel according to the first embodiment of the invention.

FIG. 1B is a planar schematic view of the common electrode of the color filter substrate of the liquid crystal panel according to the first embodiment of the invention.

As shown in FIG. 1B, which is a top view of FIG. 1A, the regions on the common electrode 40 separated by the ring-shaped grooves 41 are the regions used to suppress motion speeds of impurity ions, which are located at positions corresponding to the data lines on the array substrate. In the manufacturing process of the liquid crystal panel, the width of the data line may be about 9 μm, the width of the black matrix may be generally in the range from several μm to tens μm and have a smallest value of 4 μm according to an etching precision in practice nowadays; therefore, the groove width d of the ring-shaped grooves 41 may be in the range of about 4~6 μm, and the total width of the ring-shaped grooves D1 may be in the range of about 10~12 μm.

In the embodiment, no matter how much the voltages on the data lines are, the electrical field above the data lines around each pixel region is weak, so as to suppress the motion speeds of the impurity ions in the case that the high grey scale pixel regions and the low grey scale pixel regions are adjacent to each other in displaying a image. Hence, the influence of the impurity ions on the electrical field on the two sides of the layer of the liquid crystal molecules is reduced and the image sticking phenomenon can be alleviated. At the same time, since only a little portion of the common electrode on the color filter substrate is etched, i.e., the groove width of the ring-shaped grooves 41 is small, the light transmittance and the voltage on the common electrode are not substantially influenced.

Hereinafter, the technical solution according to the embodiment will be further described through the manufacturing process of the color filter substrate of the liquid crystal panel of the embodiment.

Figure 2:
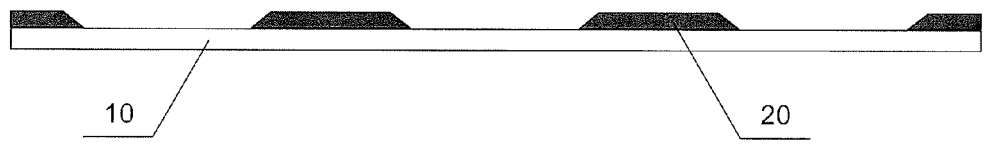
FIG. 2 is a schematic view showing the color filter substrate of the liquid crystal panel after forming a black matrix according to the first embodiment of the invention.

FIG. 2 is a schematic view showing the color filter substrate of the liquid crystal panel after forming a black matrix according to the first embodiment of the invention. Firstly, a layer of black matrix material is deposited on a substrate (such as a glass substrate or a silica substrate) 10. The layer of the black matrix material may employ a metal material (such as Cr or CrOx) or a resin material with good light blocking ability; thereafter, a black matrix 20 in a matrix form is formed, as shown in FIG. 2.

During the process of forming the black matrix, if the black matrix material employs a resin material, the forming process may comprise the following steps. Firstly, a layer of resin material is deposited by a plasma enhanced chemical vapor deposition (PECVD); then, the resin material is exposed with a normal mask so that the resin material layer is formed into a completely-exposed region and a completely-unexposed region. After being developed, the resin material layer in the completely-exposed region is completely removed, and the resin material layer in the completely-unexposed region is retained. The black matrix 20 is formed after a baking process. The completely-unexposed region can be replaced a partially-unexposed region.

If the black resin material layer employs a metal material, the forming process may comprise the following steps. Firstly, a layer of photoresist is applied on the metal material layer, and the photoresist is exposed with a normal mask so as to form a photoresist-completely-exposed region and a photoresist-completely-unexposed region; after developing, the photoresist-completely-exposed region is completely removed, and the photoresist in the photoresist-completely-unexposed region is retained. The metal material layer in the region where photoresist is completely removed is etched away by an etching process, and the black matrix 20 is formed after removing the photoresist.

Figure 3:
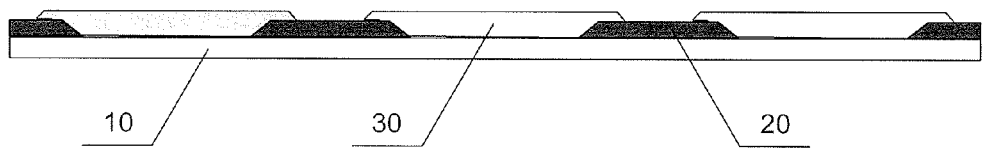
FIG. 3 is a schematic view showing the color filter substrate of the liquid crystal panel after forming color filters according to the first embodiment of the invention.

FIG. 3 is a schematic view showing the color filter substrate of the liquid crystal panel after forming color filters according to the first embodiment of the invention. On the substrate 10 after forming the above structure, a red filter material layer is applied and then the red filter material layer is exposed with a normal mask so that the red filter material layer is formed into a completely-exposed region and a completely-unexposed region. After developing, the red filter material layer in the completely-exposed region is completely removed and the red filter material layer in the completely-unexposed region is retained. The red filter pattern is formed after a baking process. With the same method, a pattern of blue filters and a pattern of green filters are formed subsequently, and the red filter pattern, the blue filter pattern and the green filter pattern constitute the color filters 30. The color filters 30 are located within the black matrix 20, between two adjacent light blocking strips, as shown in FIG. 3. In practice, the formation of the color filter pattern in the three primary colors may be an arbitrary sequence.

In addition, the sequence of the formation of the black matrix as shown in FIG. 2 and the formation of the color filter as shown in FIG. 3 may be interchanged.

Figure 4:
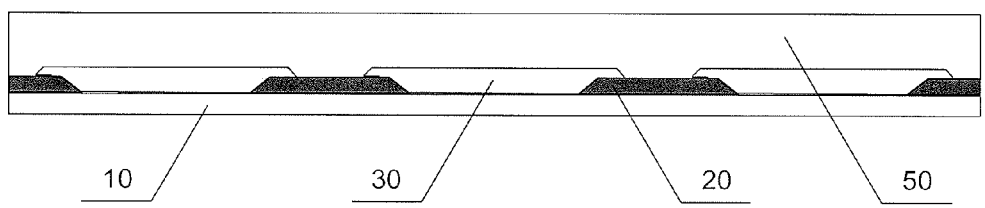
FIG. 4 is a schematic view showing the color filter substrate of the liquid crystal panel after forming a protection layer according to the first embodiment of the invention.

FIG. 4 is a schematic view showing the color filter substrate of the liquid crystal panel after forming a protection layer according to the first embodiment of the invention. As shown in FIG. 4, on the substrate 10 after forming the above structure, a protection layer 50 with a thickness of about 1.5~2.5 μm is applied so as to form a planar surface.

Figure 5:
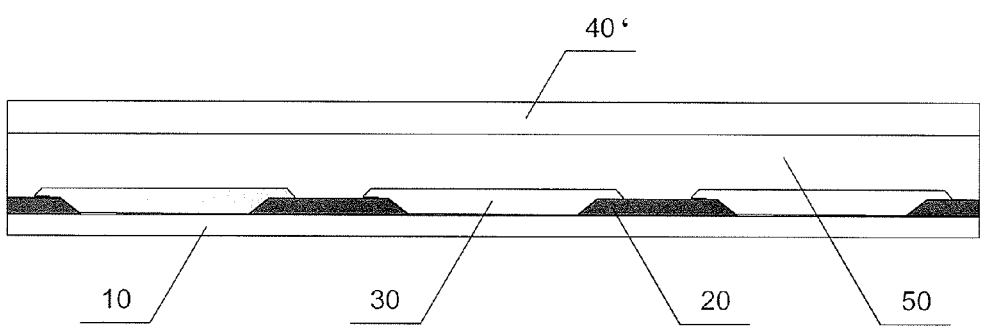
FIG. 5 is a schematic view showing the color filter substrate of the liquid crystal panel after forming a common electrode according to the first embodiment of the invention.

FIG. 5 is a schematic view showing the color filter substrate of the liquid crystal panel after forming a common electrode layer according to the first embodiment of the invention. On the substrate 10 after forming the above structure, a transparent conductive film 40' with a thickness of about 1000~1500 Å is, for example, deposited with a magnetic sputtering or thermal evaporation method. The transparent conductive film 40' may employ materials such as indium tin oxide (ITO), indium zinc oxide (IZO) and aluminum zinc oxide (AZO), and may also employ other transparent metals or metal oxides.

Figure 6:
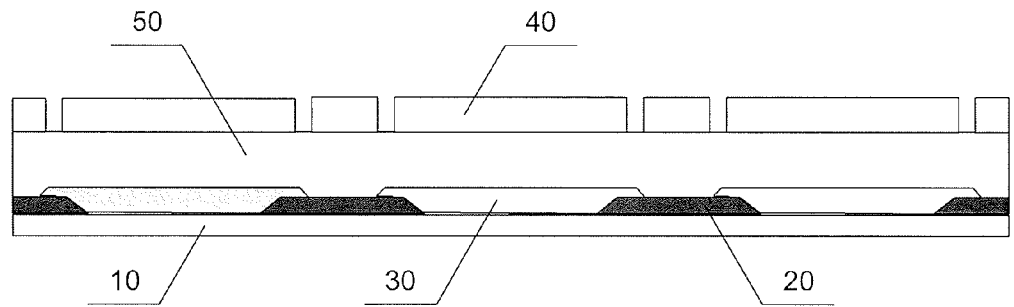
FIG. 6 is a schematic view showing the color filter substrate of the liquid crystal panel after forming cut-off patterns on the common electrode according to the first embodiment of the invention.

FIG. 6 is a schematic view showing the color filter substrate of the liquid crystal panel after forming cut-off patterns on the common electrode according to the first embodiment of the invention. On the substrate 10 after forming the above structure, a layer of photoresist is applied on the transparent conductive film 40'. The photoresist is exposed with a mask so that the photoresist is formed into a completely-unexposed region and a completely-exposed region. The completely-exposed region corresponds a region in which the ring-shaped patterns will be formed, and the completely-unexposed region corresponds to the region other than the ring-shaped groove. After being developed, the photoresist in the completely-unexposed region remains unchanged, and the photoresist in the completely-exposed region is removed. The transparent conductive film 40' is etched away with an etching process. The common electrode 40 with cut-off patterns of ring-shaped grooves 41 is formed after removing the photoresist. The ring-shaped grooves 41 as the cut-off patterns can be used to reduce the motion speeds of the impurity ions so as to alleviate the image sticking phenomenon. The position of the ring-shaped grooves 41 corresponds to the position of the data lines, as shown in FIG. 6. Hence, the color filter substrate according to the embodiment is completed, as shown in FIG. 1A. Furthermore, the width of the ring-shaped groove 41 can be adjusted by adjusting the size of the completely-exposed region on the mask for exposing.

In addition, the shapes of the ring-shaped grooves 41 may comprise a rectangular-ring shaped groove, an ellipse-ring shaped groove or a combination of a plurality of rectangular and ellipse-ring shaped grooves.

Figure 7A:
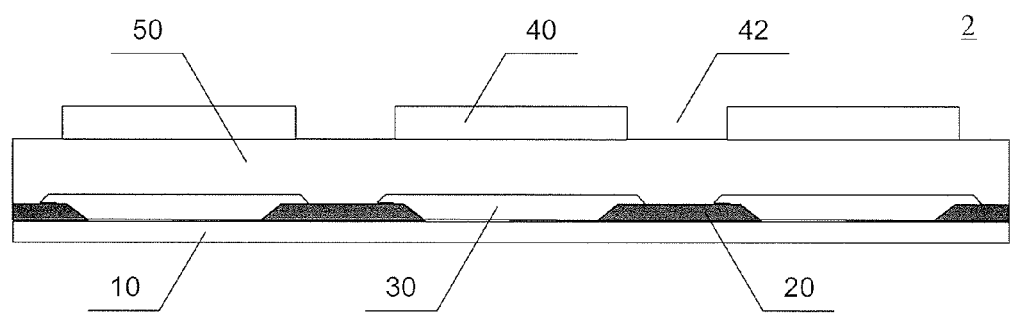
FIG. 7A is a structural schematic view of a color filter substrate of a liquid crystal panel according to a second embodiment of the invention.
Figure 7B:
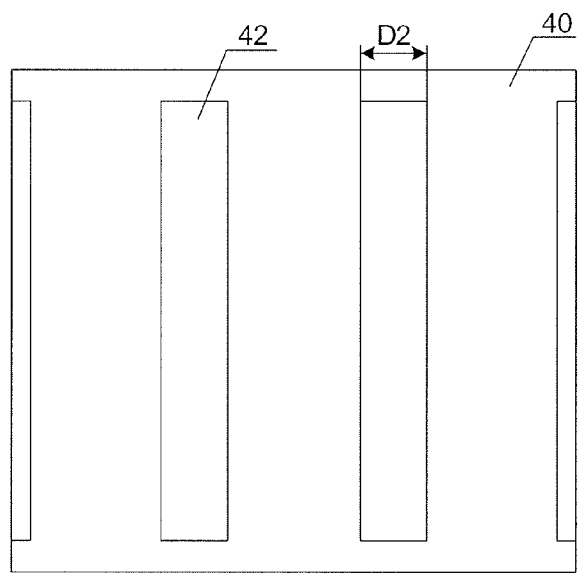
FIG. 7B is a planar schematic view of the common electrode of the color filter substrate of the liquid crystal panel according to the second embodiment of the invention.

FIG. 7A is a structural schematic view of a color filter substrate of a liquid crystal panel according to a second embodiment of the invention, which is a modification of the first embodiment. As shown in FIG. 7A, the liquid crystal panel of the embodiment comprises a color filter substrate, an array substrate and a layer of liquid crystal molecules interposed the color filter substrate and the array substrate. The color substrate 2 comprises a substrate 10, a black matrix 20 and color filters 30, a protection layer 50 and a common electrode 40. The structures of the black matrix 20, the color filters 30 and the protection layer 50 are the same as those in the first embodiment. The second embodiment is different from the first embodiment in that the cut-off patterns comprise apertures 42. The shape of the apertures 42, which are located in a position corresponding to the data lines on the array substrate, may comprise a rectangular, a circular or an ellipse shapes. FIG. 7B is a planar schematic view of the common electrode of the color filter substrate of the liquid crystal panel according to the second embodiment of the invention. As shown in FIG. 7B, the width D2 of the apertures 42 may be equal to the width of the corresponding data lines and may be in a range of about 8~10 μm. In addition, except the different shape of the cut-off patterns formed in the common electrode 40, the manufacturing process of the color filter substrate of the embodiment may be substantially the same as that of the first embodiment, and the repeated description is omitted.

Figure 8:
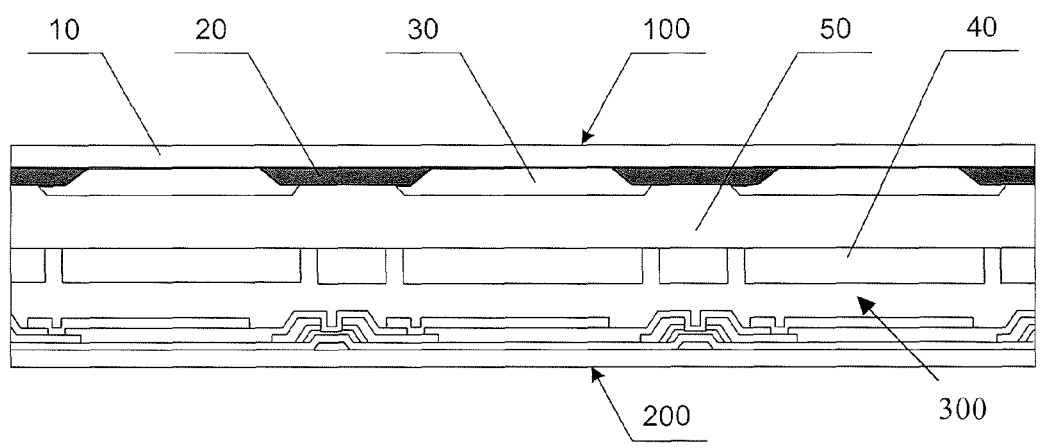
FIG. 8 is a schematic view of the liquid crystal panel according to the embodiment of the invention.

FIG. 8 is a structural schematic view of the liquid crystal panel of an embodiment of the invention. The liquid crystal panel of the embodiment of the invention may comprise a color filter substrate 100, an array substrate 200 and a layer 300 of liquid crystal molecules interposed between the color filter substrate 100 and the array substrate 200. The color filter substrate 100 may employ the structure of the color filter substrate 1 in the first embodiment, and the array substrate 200 may employ that of a conventional structure. Since the common electrode of the color filter substrate 100 is formed with cut-off patterns therein, the cut-off patterns of the embodiment may be closed ring-shaped grooves, and the position of the cut-off patterns corresponds to the position of the data lines on the array substrate. Therefore, during operation, no matter how much the signal voltages on the data lines on the array substrate 200 are, the electrical field between the data lines on the array substrate and the common electrode corresponding thereto become weak. Therefore, the motion speeds of the impurity ions, in the case that the high grey scale pixel regions and the low grey scale pixel regions are adjacent to each other, is decreased and the influence of the impurity ions on the electrical field at the two sides of the layer of liquid crystal molecules is alleviated and the image sticking phenomenon is alleviated accordingly.

In the manufacturing method of the color filter substrate of the liquid crystal panel according to the embodiment of the invention, the liquid crystal panel comprising a color filter substrate, an array substrate and a layer of liquid crystal molecules interposed between the color filter substrate and the array substrate, the manufacturing method of the liquid crystal panel comprising providing the color filter substrate and providing the array substrate. Providing the color filter substrate may comprises the following steps.

Step 1 of forming a black matrix and color filters on a substrate.

Step 2 of forming a protection layer on the substrate after Step 1.

Step 3 of forming a common electrode on the substrate after Step 2 and forming cut-off patterns used to decrease motion speeds of impurity ions on the common electrode so as to suppress image sticking.

The cut-off patterns are located at a position corresponding to data lines on the array substrate, and the cut-off patterns comprise a closed ring-shaped groove or a concave hole.

In the manufacturing method of the liquid crystal panel according to the embodiment of the invention, by forming cut-off patterns on the common electrode, no matter how much the signal voltages on the data lines on the array substrate are, the electrical field above the data lines around each pixel become weak. Therefore, the motion speeds of the impurity ions, in the case that the high grey scale pixel regions and the low grey scale pixel regions are adjacent to each other, are reduced, and the influence of the impurity ions on the electrical field at the two sides of the liquid crystal molecular is alleviated and the image sticking phenomenon is alleviated accordingly.

An example of the above step 3 may comprise the following steps.

Step 31 of forming a layer of transparent conductive film on the substrate after Step 2.

Step 32 of applying a layer of photoresist on the transparent conductive film.

Step 33 of exposing the photoresist with a mask so as to form a completely-unexposed region and a completely-exposed region, the completely-exposed region corresponding to a region in which the cut-off patterns are located, and the completely-unexposed region corresponding to a region other than the region in which the cut-off patterns are located.

Step 34 of performing a developing process so that the photoresist in the completely-unexposed region remains unchanged and the photoresist in the completely-exposed region is removed.

Step 35 of etching away the transparent conductive film in the completely exposed region by an etching process so as to form the common electrode with the cut-off patterns.

Step 36 of removing the remaining photoresist.

In the above description, a positive type photoresist is used as an example of photoresist material. But, a negative type photoresist can be used instead, in which case the exposed region of the photoresist is retained after developing and the unexposed region of the photoresist is removed after developing. In addition, the completely-unexposed region can be replaced with a partially unexposed (or exposed) region in which the photoresist is partially exposed so that, after developing, a layer of photoresist is still retained.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A liquid crystal panel, comprising
a color filter substrate;
an array substrate; and
a layer of liquid crystal molecules interposed between the color filter substrate and the array substrate,
wherein the color filter substrate includes a black matrix, color filters, a protection layer and a common electrode formed a substrate, and
wherein cut-off patterns used to decrease motion speeds of impurity ions are formed in the common electrode so as to suppress image sticking,
wherein the cut-off patterns comprise closed ring-shaped grooves.

2. The liquid crystal panel of claim 1, wherein the cut-off patterns are located at a position corresponding to data lines on the array substrate.

3. The liquid crystal panel of claim 1, wherein a groove width of the ring-shaped grooves is about 4~6 μm, and a total width of the ring-shaped grooves is about 10~12 μm.

4. The liquid crystal panel of claim 2, wherein a groove width of the ring-shaped groove is about 4~6 μm, and a total width of the ring-shaped groove is about 10~12 μm.

5. A manufacturing method of a liquid crystal panel, the liquid crystal panel comprising a color filter substrate, an array substrate and a layer of liquid crystal molecules interposed between the color filter substrate and the array substrate, the manufacturing method of the liquid crystal panel comprising providing the color filter substrate and providing the array substrate, wherein providing the color filter substrate comprises:
  step 1 of forming a black matrix and color filters on a substrate;
  step 2 of forming a protection layer on the substrate after step 1; and
  step 3 of forming a common electrode on the substrate after step 2, wherein cut-off patterns used to decrease motion speeds of impurity ions are formed in the common electrode so as to suppress image sticking,
  wherein the cut-off patterns comprise closed ring-shaped grooves.

6. The manufacturing method of the liquid crystal panel of claim 5, wherein the cut-off patterns are located at a position corresponding to data lines on the array substrate.

7. The manufacturing method of the liquid crystal panel of claim 5, wherein forming the common electrode in Step 3 comprises:
  step 31 of forming a layer of transparent conductive film on the substrate after Step 2;
  step 32 of applying a layer of photoresist on the transparent conductive film;
  step 33 of exposing the photoresist with a mask so as to form a photoresist-retained region and a photoresist-removed region, the photoresist-removed region corresponding to a region in which the cut-off patterns are located, and the photoresist-retained region corresponding to a region other than the region in which the cut-off patterns are located;
  step 34 of performing a developing process so that the photoresist in the photoresist-retained region at least partially remains and the photoresist in the photoresist-removed region is removed;
  step 35 of etching away the transparent conductive film in the photoresist-removed region by an etching process so as to form the common electrode with the cut-off patterns; and
  step 36 of removing the remaining photoresist.

8. A liquid crystal panel, comprising
a color filter substrate;
an array substrate; and
a layer of liquid crystal molecules interposed between the color filter substrate and the array substrate,
wherein the color filter substrate includes a black matrix, color filters, a protection layer and a common electrode formed a substrate, and
wherein cut-off patterns used to decrease motion speeds of impurity ions are formed in the common electrode so as to suppress image sticking,
wherein the cut-off patterns comprise apertures, and
wherein a width of the apertures is about 8~10 μm.

9. The liquid crystal panel of claim 8, wherein the cut-off patterns are located at a position corresponding to data lines on the array substrate.

\* \* \* \* \*